(12) United States Patent
Fujiwara et al.

(10) Patent No.: US 12,154,761 B2
(45) Date of Patent: Nov. 26, 2024

(54) PLASMA PROCESSING APPARATUS AND PLASMA PROCESSING METHOD

(71) Applicant: Tokyo Electron Limited, Tokyo (JP)

(72) Inventors: Naoki Fujiwara, Miyagi (JP);
Mitsunori Ohata, Miyagi (JP);
Takahiro Takeuchi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 18/372,156

(22) Filed: Sep. 25, 2023

(65) Prior Publication Data

US 2024/0014006 A1   Jan. 11, 2024

Related U.S. Application Data

(63) Continuation of application No. 17/409,255, filed on Aug. 23, 2021, now Pat. No. 11,798,787.

(30) Foreign Application Priority Data

Aug. 31, 2020   (JP) .................................. 2020-146197
Jun. 4, 2021   (JP) .................................. 2021-094193

(51) Int. Cl.
*H01J 37/32*   (2006.01)

(52) U.S. Cl.
CPC .. *H01J 37/32174* (2013.01); *H01J 37/32146* (2013.01)

(58) Field of Classification Search
CPC ........... H01J 37/32091; H01J 37/32146; H01J 37/32165; H01J 37/32174; H01J 37/32183; H01J 37/32926
See application file for complete search history.

(56) References Cited

U.S. PATENT DOCUMENTS

| | | | |
|---|---|---|---|
| 9,761,414 B2* | 9/2017 | Marakhtanov | .... H01J 37/32449 |
| 2010/0098882 A1 | 4/2010 | Lubomirsky et al. | |
| 2013/0214683 A1 | 8/2013 | Valcore, Jr. et al. | |
| 2014/0367043 A1 | 12/2014 | Bishara et al. | |
| 2015/0072530 A1 | 3/2015 | Kim et al. | |

(Continued)

FOREIGN PATENT DOCUMENTS

| | | |
|---|---|---|
| JP | 2012-054534 A | 3/2012 |
| JP | 2018-535504 A | 11/2018 |
| JP | 2019-067503 A | 4/2019 |

*Primary Examiner* — Tung X Le
(74) *Attorney, Agent, or Firm* — XSENSUS LLP

(57) ABSTRACT

A plasma processing apparatus includes: a plasma processing apparatus includes: a plasma processing chamber; a substrate support; a source RF generator coupled to the plasma processing chamber, and configured to generate a source RF pulsed signal; a first bias RF generator configured to generate a first bias RF pulsed signal; a second bias RF generator configured to generate a second bias RF pulsed signal; a first separation circuit connected between the first bias RF generator and the substrate support, and configured to suppress a coupling of the second bias RF pulsed signal from the second bias RF generator to the first bias RF generator, and a second separation circuit connected between the second bias RF generator and the substrate support, and configured to suppress a coupling of the first bias RF pulsed signal from the first bias RF generator to the second bias RF generator.

17 Claims, 10 Drawing Sheets

(56) References Cited

U.S. PATENT DOCUMENTS

| | | | |
|---|---|---|---|
| 2017/0103873 A1* | 4/2017 | Kawasaki | H01J 37/32183 |
| 2018/0204708 A1* | 7/2018 | Tan | H01J 37/32165 |
| 2018/0261430 A1* | 9/2018 | Kawasaki | H01J 37/32935 |
| 2020/0075290 A1 | 3/2020 | Kawasaki et al. | |
| 2021/0217588 A1 | 7/2021 | Savas et al. | |
| 2021/0320012 A1* | 10/2021 | Shimizu | H01J 37/32183 |
| 2022/0189738 A1* | 6/2022 | Evans | H01J 37/32183 |
| 2022/0216038 A1 | 7/2022 | Wu et al. | |

* cited by examiner

PLASMA PROCESSING APPARATUS AND PLASMA PROCESSING METHOD

CROSS-REFERENCE TO RELATED APPLICATIONS

This application is a continuation application of U.S. patent application Ser. No. 17/409,255, filed on Aug. 23, 2021, which claims priorities from Japanese Patent Application Nos. 2020-146197 and 2021-094193, filed on Aug. 31, 2020 and Jun. 4, 2021, with the Japan Patent Office, all of which are incorporated herein in their entireties by reference.

TECHNICAL FIELD

The present disclosure relates to a plasma processing apparatus and a plasma processing method.

BACKGROUND

Japanese Laid-Open Patent Publication No. 2019-067503 discloses, for example, an inductively coupled plasma (ICP) apparatus that includes two radio-frequency power supplies to supply radio-frequency powers of two frequencies to an antenna above a chamber and a lower electrode (susceptor). Of the two radio-frequency power supplies, one radio-frequency power supply supplies a bias radio-frequency power of a frequency of, for example, 13 MHz to the lower electrode. The antenna is provided above the chamber, and the other radio-frequency power supply supplies a plasma excitation radio-frequency power of a frequency of, for example, 27 MHz to the central point of the line that makes up the outer coil of the antenna, or the vicinity thereof.

SUMMARY

According to an aspect of the present disclosure, a plasma processing apparatus includes: a plasma processing chamber; a substrate support disposed in the plasma processing chamber; a source RF generator coupled to the plasma processing chamber, and configured to generate a source RF pulsed signal; a first bias RF generator configured to generate a first bias RF pulsed signal; a second bias RF generator configured to generate a second bias RF pulsed signal; a first separation circuit connected between the first bias RF generator and the substrate support, and configured to suppress a coupling of the second bias RF pulsed signal from the second bias RF generator to the first bias RF generator and supply the first bias RF pulsed signal from the first bias RF generator to the substrate support, and a second separation circuit connected between the second bias RF generator and the substrate support, and configured to suppress a coupling of the first bias RF pulsed signal from the first bias RF generator to the second bias RF generator and supply the second bias RF pulsed signal from the second bias RF generator to the substrate support.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
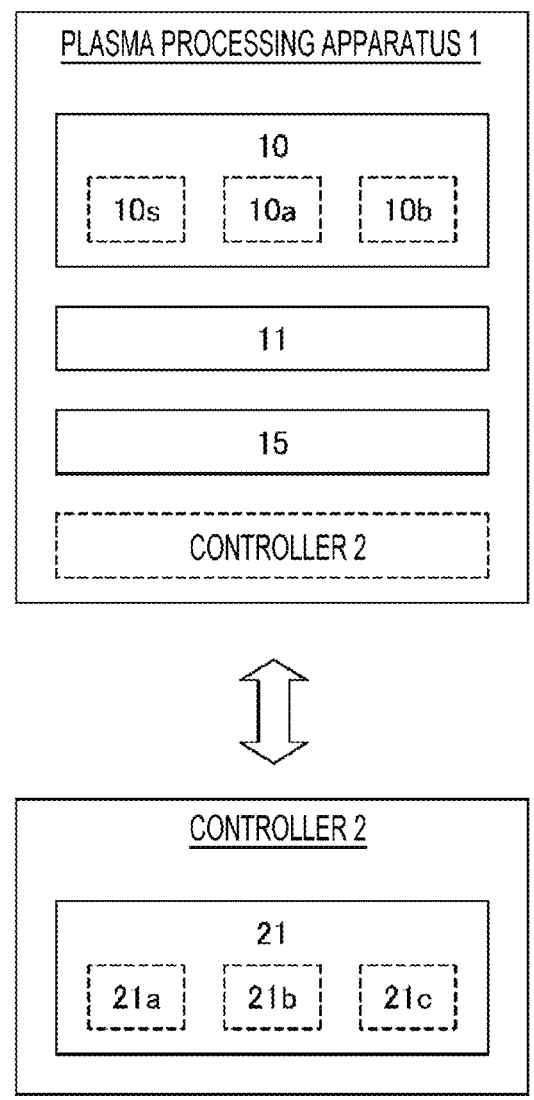
FIG. 1 is a schematic cross-sectional view illustrating an example of a plasma processing system according to an embodiment.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, embodiments for implementing the present disclosure will be described with reference to the drawings. In the respective drawings, the same components will be denoted by the same reference numerals, and overlapping descriptions thereof may be appropriately omitted.

[Plasma Processing System]

Figure 2:
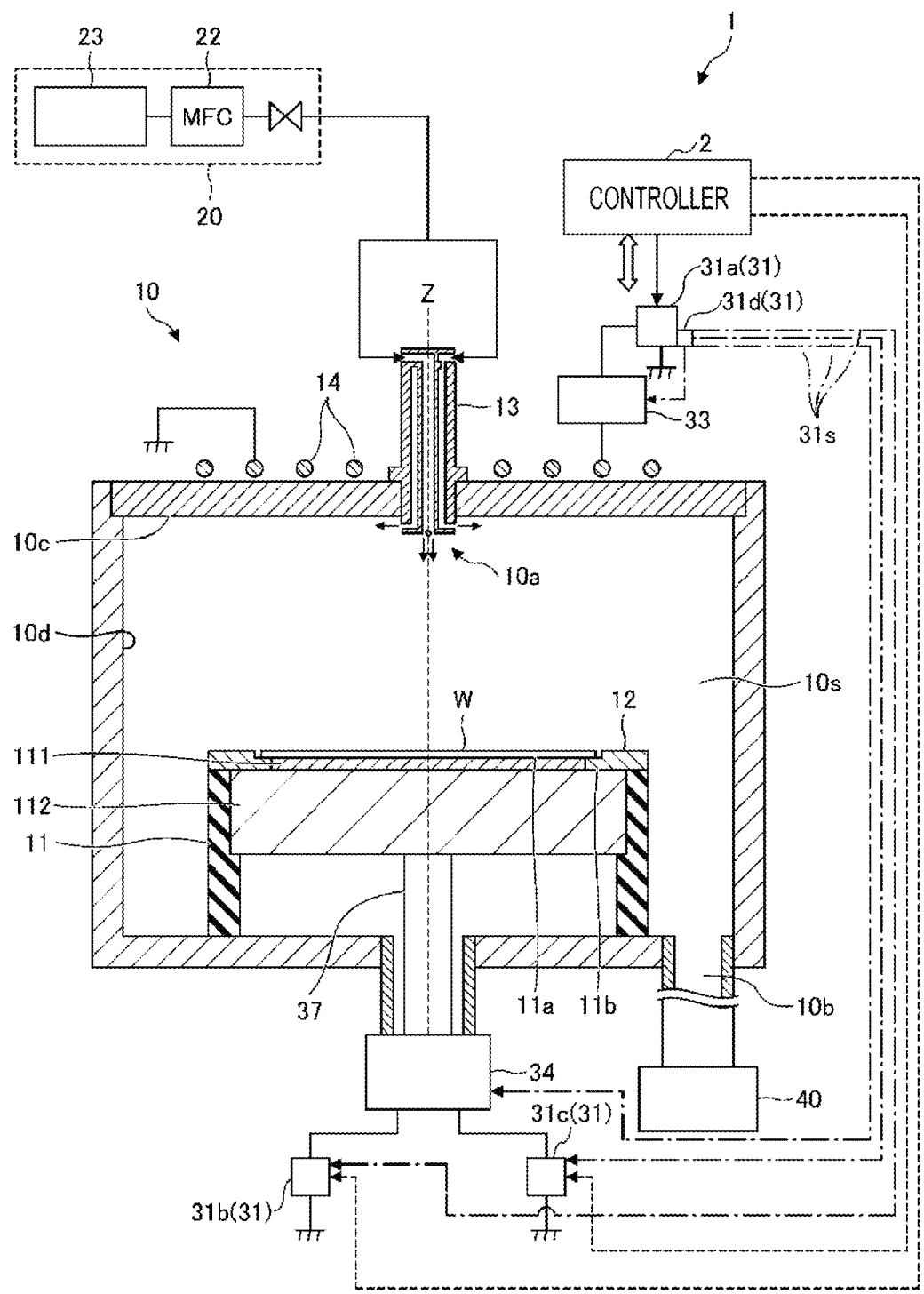
FIG. 2 is a view illustrating an example of a plasma processing apparatus according to an embodiment.

First, a plasma processing system according to an embodiment will be described with reference to FIGS. 1 and 2. FIG. 1 is a schematic cross-sectional view illustrating an example of the plasma processing system according to the embodiment. FIG. 2 is a view illustrating an example of a plasma processing apparatus 1 according to an embodiment.

In an embodiment, the plasma processing system includes the plasma processing apparatus 1 and a controller 2. The plasma processing apparatus 1 is configured to supply three radio-frequency power pulses (three RF pulsed signals) into a chamber 10, thereby generating plasma from a processing gas in the chamber 10. Then, the plasma processing apparatus 1 exposes the generated plasma to a substrate so as to process the substrate.

The plasma processing apparatus 1 includes a chamber (a plasma processing chamber) 10, a substrate support 11, and a plasma generator. The chamber 10 defines a plasma processing space 10s. Further, the chamber 10 includes a gas inlet 10a for supplying at least one processing gas into the plasma processing space 10s, and a gas outlet 10b for discharging the gas from the plasma processing space. The gas inlet 10a is connected to at least one gas supply 20.

The gas outlet 10b is, for example, an exhaust port provided at the bottom of the chamber 10, and is connected to an exhaust system 40. The exhaust system 40 may be connected to the gas outlet. The exhaust system 40 may include a pressure valve and a vacuum pump. The vacuum pump may include a turbo molecular pump, a roughing pump, or a combination thereof.

The substrate support 11 is disposed in the plasma processing space 10s to support a substrate W. The plasma generator is configured to generate plasma from at least one processing gas supplied into the plasma processing space 10s.

The controller 2 processes computer-executable instructions for instructing the plasma processing apparatus 1 to execute various processes to be described herein below. The controller 2 may be configured to control the respective components of the plasma processing apparatus 1 to execute the various processes to be described herein below. In an embodiment, as illustrated in FIG. 1, a portion of the controller 2 or the entire controller 2 may be included in the plasma processing apparatus 1. The controller 2 may include, for example, a computer 21. The computer 21 may include, for example, a processing unit (central processing unit (CPU)) 21a, a storage unit 21b, and a communication interface 21c. The processing unit 21a may be configured to perform various control operations based on programs stored in the storage unit 21b. The storage unit 21b may include a random access memory (RAM), a read only memory (ROM), a hard disk drive (HDD), a solid state drive (SSD), or a combination thereof. The communication interface 21c may communicate with the plasma processing apparatus 1 through a communication line such as a local area network (LAN).

Hereinafter, an example of a configuration of the plasma processing apparatus 1 will be further described, using the inductively coupled plasma processing apparatus of FIG. 2 as an example. The plasma processing apparatus 1 includes the chamber 10. The chamber 10 includes a dielectric window 10c and a side wall 10d. The dielectric window 10c and the side wall 10d define the plasma processing space 10s in the chamber 10. Further, the plasma processing apparatus 1 includes the substrate support 11, a gas introduction unit 13, the gas supply 20, a power supply, and the antenna 14.

The substrate support 11 is disposed in the plasma processing space 10s inside the chamber 10. The antenna 14 is disposed on or above the chamber 10 (the dielectric window 10c).

The substrate support 11 includes a main body and an annular member (an edge ring) 12. The main body has a central region (a substrate support surface) 11a for supporting the substrate (wafer) W. and an annular region (an edge ring support surface) 11b for supporting the annular member 12. The annular region 11b of the main body surrounds the central region 11a of the main body. The substrate W is placed on the central region 11a of the main body, and the annular member 12 is disposed on the annular region 11b of the main body to surround the substrate W on the central region 11a of the main body. In the embodiment, the main body includes an electrostatic chuck 111 and a conductive member 112. The electrostatic chuck 111 is disposed on the conductive member 112. The conductive member 112 functions as an RF electrode, and the upper surface of the electrostatic chuck 111 functions as a substrate supporting surface (the central region 11a). Although not illustrated, in an embodiment, the substrate support 11 may include a temperature control module configured to adjust at least one of the electrostatic chuck 111 and the substrate W to a target temperature. The temperature control module may include a heater, a flow path, or a combination thereof. A temperature control fluid such as a refrigerant or a heat transfer gas flows through the flow path. The chamber 10, the substrate support 11, and the annular member 12 are arranged to coincide with each other around the central axe Z.

The gas introduction unit 13 is configured to supply at least one processing gas from the gas supply 20 into the plasma processing space 10s. In the embodiment, the gas introduction unit 13 is disposed above the substrate support 11, and attached to the central opening formed in the dielectric window 10c.

The gas supply 20 may include at least one gas source 23 and at least one flow rate controller 22. In the embodiment, the gas supply 20 is configured to supply one or more processing gases from the respective corresponding gas sources 23 to the gas introduction unit 13 via the respective corresponding flow rate controllers 22. Each flow rate controller 22 may include, for example, a mass flow controller or a pressure-controlled flow rate controller. Further, the gas supply 20 may include one or more flow rate modulation devices that modulate or pulse flow rates of one or more processing gases.

The power supply includes an RF power supply 31 coupled to the chamber 10. The RF power supply 31 is configured to supply three RF signals (RF powers) to the conductive member 112 of the substrate support 11 or the antenna 14. As a result, plasma is formed from at least one processing gas supplied into the plasma processing space 10s. The plasma generator may include the gas supply 20 that supplies at least one processing gas into the plasma processing space 10s, and the RF power supply 31, and may be configured to generate plasma from the processing gas.

The antenna 14 includes one or more coils. In an embodiment, the antenna 14 may include an outer coil and an inner coil that are coaxially arranged. In this case, the RF power supply 31 may be connected to both the outer coil and the inner coil, or may be connected to either the outer coil or the inner coil. In the former case, the same RF generator may be connected to both the outer coil and the inner coil, or separate RF generators may be connected to the outer coil and the inner coil, respectively.

In the embodiment, the RF power supply 31 includes a source RF generator 31a, a first bias RF generator 31b, and a second bias RF generator 31c. The source RF generator 31a is coupled to the antenna 14, and the first bias RF generator 31b and the second bias RF generator 31c are connected to the conductive member 112. The source RF generator 31a is coupled to the antenna 14 via a first matching circuit 33, and configured to generate a source RF pulsed signal (hereinafter, also referred to as an HF power) for generating plasma. In an embodiment, the source RF pulsed signal has a frequency in a range of 10 MHz to 100 MHz. In an embodiment, the source RF pulsed signal has a frequency in a range of 20 MHz to 60 MHz. In an embodiment, the source RF pulsed signal has a frequency of 100 MHz or more. The generated source RF pulsed signal is supplied to the antenna 14. The source RF pulsed signal has at least three power levels, and each power level is zero (0) or more. Accordingly, the source RF pulsed signal may have High/Middle/Low power levels, which are larger than zero (0). Further, the source RF pulsed signal may have High/Low power levels and a zero power level (OFF).

Further, the first bias RF generator 31b is connected to the conductive member 112 of the substrate support 11 via a second matching circuit 34 and a power feeding line 37, and configured to generate a first bias RF pulsed signal (hereinafter, also referred to as an LF1 power). The generated first bias RF pulsed signal is supplied to the conductive member 112 of the substrate support 11. In an embodiment, the first bias RF pulsed signal has a frequency different from the frequency of the source RF pulsed signal. In an embodiment, the first bias RF pulsed signal has a frequency lower than the frequency of the source RF pulsed signal. In an embodiment, the first bias RF pulsed signal has the same frequency as the frequency of the source RF pulsed signal. In an embodiment, the first bias RF pulsed signal has a frequency in a range of 1 MHz to 40 MHz. In an embodiment, the first bias RF pulsed signal has a frequency in a range of 1.2 MHz to 15 MHz. The first bias RF pulsed signal has at least two power levels, and each power level is zero (0) or more. Accordingly, the first bias RF pulsed signal may have High/Low power levels, which are zero (0) or more. The first bias RF pulsed signal may have a power level more than zero (0) and a zero (0) power level, that is, ON/OFF signals.

Further, the second bias RF generator 31c is connected to the conductive member 112 of the substrate support 11 via a second matching circuit 34 and a power feeding line 37, and configured to generate a second bias RF pulsed signal (hereinafter, also referred to as an LF2 power). The generated second bias RF pulsed signal is supplied to the conductive member 112 of the substrate support 11. In an embodiment, the second bias RF pulsed signal has a frequency lower than the frequency of the first bias RF pulsed signal. In an embodiment, the second bias RF pulsed signal has a frequency in a range of 100 kHz to 5 MHz. In an embodiment, the second bias RF pulsed signal has a frequency in a range of 200 kHz to 4 MHz. In an embodiment, the second bias RF pulsed signal has a frequency in a range of 400 kHz to 2 MHz. The first bias RF pulsed signal has at least two power levels, and each power level is zero (0) or more. Accordingly, the second bias RF pulsed signal may have High/Low power levels, which are zero (0) or more. The second bias RF pulsed signal may have a power level more than zero (0) and a zero (0) power level, that are ON and OFF signals.

In this way, the source RF pulsed signal, the first bias RF pulsed signal, and the second bias RF pulsed signal are pulsed. The first bias RF pulsed signal and the second bias RF pulsed signal are pulsed between the ON state and the OFF state or between the two or more different ON states (High/Low). The source RF pulsed signal is pulsed among the two or more different ON states (High/Low) and the OFF state, or among the three or more different ON states (High/Middle/Low).

The first matching circuit 33 is connected to the source RF generator 31a and the antenna 14. The first matching circuit 33 enables the source RF pulsed signal to be supplied from the source RF generator 31a to the antenna 14 via the first matching circuit 33.

The second matching circuit 34 is connected to the first bias RF generator 31b, the second bias RF generator 31c, and the substrate support 11 (the conductive member 112). The second matching circuit 34 enables the first bias RF pulsed signal to be supplied from the first bias RF generator 31b to the substrate support 11 via the second matching circuit 34. Further, the second matching circuit 34 enables the second bias RF pulsed signal to be supplied from the second bias RF generator 31c to the substrate support 11 via the second matching circuit 34.

The RF power supply 31 further includes a synchronization signal generator 31d. The synchronization signal generator 31d is configured to generate a synchronization signal 31s for synchronizing the source RF generator 31a, the first bias RF generator 31b, the second bias RF generator 31c, the first matching circuit 33, and the second matching circuit 34 with each other. The synchronization signal generator 31d is disposed in any one of the source RF generator 31a, the first bias RF generator 31b, and the second bias RF generator 31c. Then, the synchronization signal generator 31d is configured to supply the synchronization signal 31s to the remaining two RF generators, the first matching circuit 33, and the second matching circuit 34. In an embodiment, the synchronization signal generator 31d is disposed in the source RF generator 31a and configured to generate the synchronization signal 31s to the first bias RF generator 31b, the second bias RF generator 31c, the first matching circuit 33, and the second matching circuit 34. The synchronization signal generator 31d may be disposed separately. In this case, the synchronization signal 31s is supplied to the source RF generator 31a, the first bias RF generator 31b, the second bias RF generator 31c, the first matching circuit 33, and the second matching circuit 34.

The controller 2 outputs a control signal for instructing to supply each pulsed signal to each of the source RF generator 31a, the first bias RF generator 31b, and the second bias RF generator 31c. As a result, the source RF pulsed signal, the first bias RF pulsed signal, and the second bias RF pulsed signal are supplied at predetermined timings, and plasma is generated from the processing gas in the chamber 10. Then, the generated plasma is exposed to the substrate, so as to perform a substrate processing. As a result, the efficiency of the process may be improved, and thus, the substrate processing may be implemented with a high accuracy. The timings w % ben the controller 2 controls the ON/OFF states of the source RF pulsed signal, the first bias RF pulsed signal, and the second bias RF pulsed signal, or the power levels that are zero (0) or more will be described later.

Example of Internal Configuration of Second Matching Circuit

Figure 3:
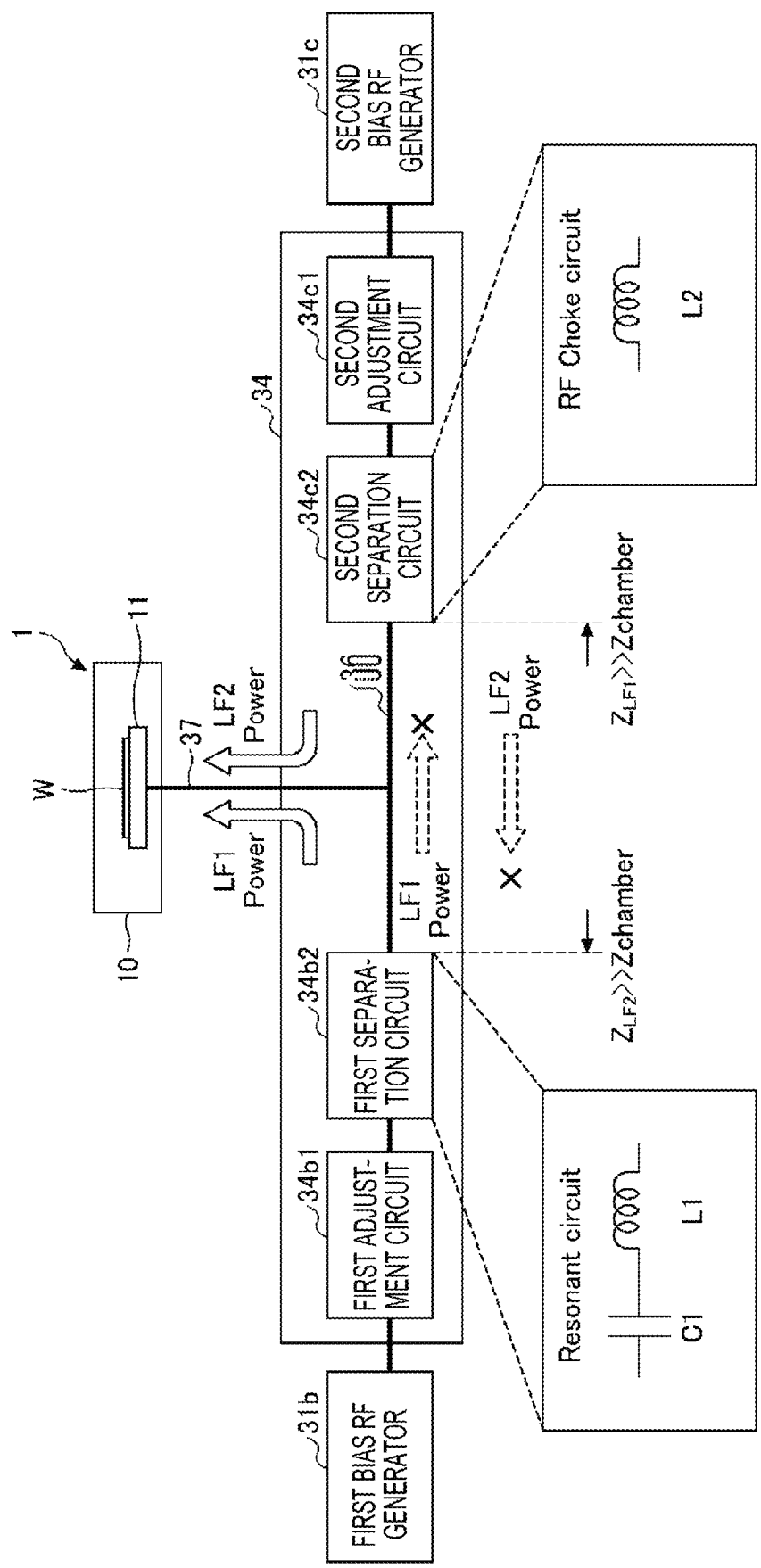
FIG. 3 is a view illustrating an example of a matching circuit of two bias RF pulsed signals according to an embodiment.

Next, an example of the configuration of the second matching circuit 34 will be described with reference to FIG. 3. FIG. 3 is a view illustrating an example of the internal configuration of the second matching circuit 34 according to an embodiment.

The first bias RF generator 31b and the second bias RF generator 31c are connected to the substrate support 11 (the conductive member 112) via the second matching circuit 34 and the power feeding line 37. The first bias RF pulsed signal supplied from the first bias RF generator 31b will also be referred to as the LF1 power in the following descriptions. Further, the second bias RF pulsed signal supplied from the second bias RF generator 31c will also be referred to as the LF2 power in the following descriptions.

When the first bias RF pulsed signal (the LF1 power) supplied from the first bias RF generator 31b is coupled to the opposite side (the second bias RF generator 31c) via the power feeding line 36 in the second matching circuit 34, the supply efficiency of the LF1 power supplied to the chamber 10 is deteriorated. Similarly, when the second bias RF pulsed signal (the LF2 power) supplied from the second bias RF generator 31c is coupled to the opposite side (the first bias RF generator 31b) via the power feeding line 36, the supply efficiency of the LF2 power supplied to the chamber 10 is deteriorated. Then, since the supply of the bias power to the chamber 10 is reduced, it becomes difficult to control the ion energy or the like, and the process performance is deteriorated.

Thus, the second matching circuit 34 according to the present embodiment includes a first adjustment circuit 34b1, a first separation circuit 34b2, a second adjustment circuit 34c1, and a second separation circuit 34c2. The first adjustment circuit 34b1 and the first separation circuit 34b2 are connected between the first bias RF generator 31b and the power feeding line 37. The second adjustment circuit 34c1 and the second separation circuit 34c2 are connected between the second bias RF generator 31c and the power feeding line 37. With this configuration, the first bias RF pulsed signal (the LF1 power) generated in the first bias RF generator 31b is supplied to the substrate support 11 (the conductive member 112), while being suppressed from being coupled to the second bias RF generator 31c. Further, the second bias RF pulsed signal (the LF2 power) generated in the second bias RF generator 31c is supplied to the substrate support 11 (the conductive member 112), while being suppressed from being coupled to the first bias RF generator 31b.

The first adjustment circuit 34b1 includes a variable element, and is configured to match the impedance of the load side (the substrate support 11) of the first bias RF generator 31b with the output impedance of the first bias RF generator 31b. In an embodiment, the variable element of the first adjustment circuit 34b1 is a variable capacitor.

The second separation circuit 34c2 is connected between the second bias RF generator 31c and the substrate support 11, and suppresses the coupling of the first bias RF pulsed signal which is the LF1 power from the first bias RF generator 31b.

The second adjustment circuit 34c1 includes a variable element, and is configured to match the impedance of the load side (the substrate support 11) of the second bias RF generator 31c with the output impedance of the second bias RF generator 31c. In an embodiment, the variable element of the second adjustment circuit 34c1 is a variable inductor.

The first separation circuit 34b2 is connected between the first bias RF generator 31b and the substrate support 11, and suppresses the coupling of the second bias RF pulsed signal which is the LF2 power from the second bias RF generator 31c.

The second separation circuit 34c2 is an RF choke circuit that includes an inductor L2. The first separation circuit 34b2 is a resonant circuit that includes a capacitor C1 and an inductor L1. The first separation circuit 34b2 is configured by the capacitor C1 and the inductor L1. The second separation circuit 34c2 is configured by the inductor L2.

The first separation circuit 34b2 sets circuit constants of C1 and L1 such that the impedance viewed from the first bias RF pulsed signal seems to be zero (0) or close to zero (0), and the impedance viewed from the second bias RF pulsed signal seems to be high and seems to be a wall close to the first bias RF generator 31b. Then, when the impedance of the first separation circuit 34b2 viewed from the second bias RF pulsed signal is $Z_{LF2}$, and the load impedance of the plasma is $Z_{chamber}$, $Z_{LF2} \gg Z_{chamber}$ is established.

Further, the second separation circuit 34c2 sets a circuit constant of L2 such that the impedance viewed from the second bias RF pulsed signal seems to be zero (0) or close to zero (0), and the impedance viewed from the first bias RF pulsed signal seems to be high and seems to be a wall close to the second bias RF generator 31c. Then, when the impedance of the second separation circuit 34c2 viewed from the first bias RF pulsed signal is $Z_{LF1}$, $Z_{LF1} \gg Z_{chamber}$ is established.

By setting the circuit constants of the first separation circuit 34b2 as described above, the impedance $Z_{LF2}$ of the first separation circuit 34b2 becomes much larger than the load impedance $Z_{chamber}$ of the plasma. Accordingly, the first separation circuit 34b2 suppresses the coupling of the second bias RF pulsed signal from the second bias RF generator 31c ("LF2 Power→X" in FIG. 3). As a result, the LF2 power is supplied into the chamber 10 through the power feeding line 37, so that the deterioration of the supply efficiency of the LF2 power may be suppressed.

Similarly, by setting the circuit constant of the second separation circuit 34c2 as described above, the impedance $Z_{LF1}$ of the second separation circuit 34c2 becomes much larger than the load impedance $Z_{chamber}$ of the plasma. Accordingly, the second separation circuit 34c2 suppresses the coupling of the first bias RF pulsed signal from the first bias RF generator 31b ("LF1 Power→X" in FIG. 3). As a result, the LF1 power is supplied into the chamber 10 through the power feeding line 37, so that the deterioration of the supply efficiency of the LF1 power may be suppressed.

With this configuration, the pulsed signals of the two bias powers (the LF1 power and the LF2 power) having different frequencies may be efficiently supplied to the substrate support 11.

[Pulsed Signals]

For example, in a process of etching a deep hole having a high aspect ratio, the incidence angle of ions may be made vertical, or the mask selectivity may be increased, by using the pulsed signals of the HF power, the LF1 power, and the LF2 power.

Figure 4:
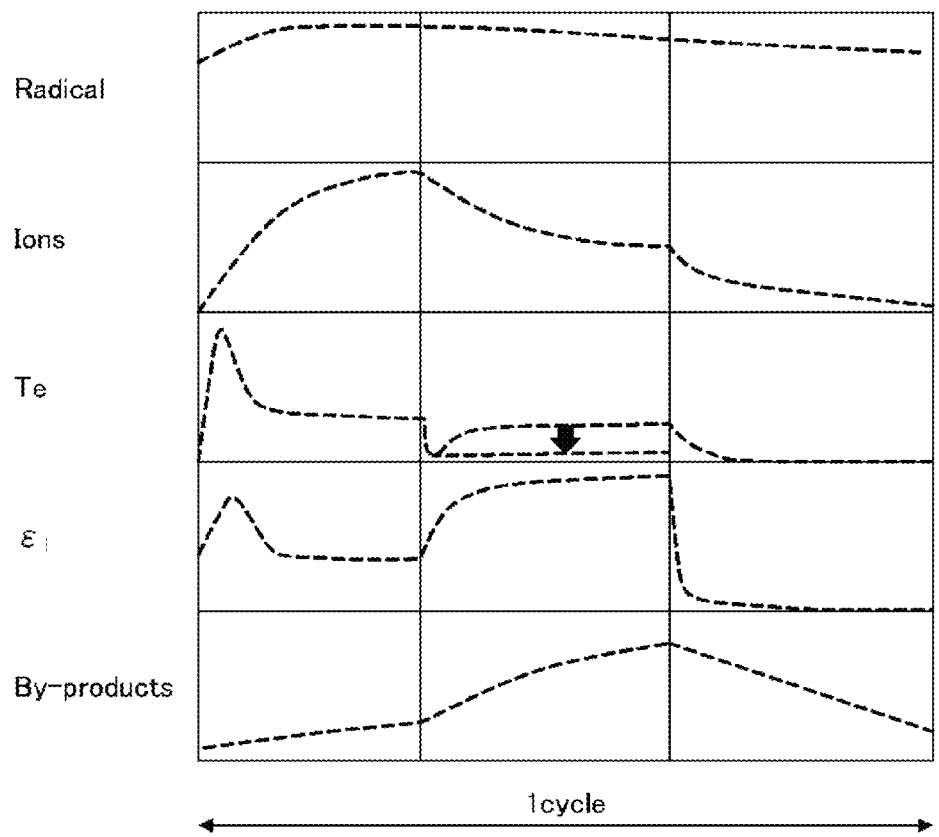
FIG. 4 is a view illustrating examples of radicals, ions, an electron temperature, an ion energy, and by-products.

FIG. 4 is a view illustrating examples of radicals, ions, an electron temperature, an ion energy, and by-products. The horizontal axis of FIG. 4 represents the time that elapses after the supply of the RF power is stopped (OFF) (one cycle). The vertical axis of FIG. 4 represents the states of the radicals (Radical), the ions (Ions), the electron temperature (Te), the ion energy ($\varepsilon_1$), and the by-products (By-products) in each time from the OFF time.

According to the states, while the variation of the radicals (Radical) since the OFF state of the RF power is slow, the variations of the ions (Ions) and the plasma temperature (Te) since the OFF state of the RF power are faster than the variation of the radicals. The pulsed signals of the HF power and the LF power (e.g., the LF1 power and the LF2 power) are controlled in consideration of, for example, the attenuation of radicals or ions in plasma or the variation of energy. As for an example of the pulsed signal of the LF power supplied after the HF power is turned OFF, a control may be considered which turns OFF the LF power during the initial time when the plasma temperature (Te) is high, and turns ON the LF power after the plasma temperature (Te) decreases. As a result, the ions may be effectively drawn into the substrate, using the LF power in the time when the ions still remain, but the plasma temperature (Te) is low.

As for another example of the pulsed signal of the LF power supplied after the HF power is turned OFF, the LF2 power may be controlled, by using $\varepsilon_1$ that indicates the ion energy as a plasma parameter, during the time when the plasma electron temperature (Te) does not substantially vary. As a result, by controlling the ion energy ($\varepsilon_1$), the incidence angle of ions may be controlled to be more vertical.

In this way, the timings for turning ON/OFF the HF power and the LF power are finely controlled according to the movements of the plasma parameters such as the radicals, the ions, the plasma electron temperature, the ion energy, and the by-products. As a result, the performance of the process may be improved. Hereinafter, the timings for supplying the pulsed signals of the radio-frequency powers will be described with reference to FIGS. 5 to 8. The timings for supplying the pulsed signals of the radio-frequency powers are controlled by the controller 2.

(Pulsed Signals of Two Frequencies)

Figure 5:
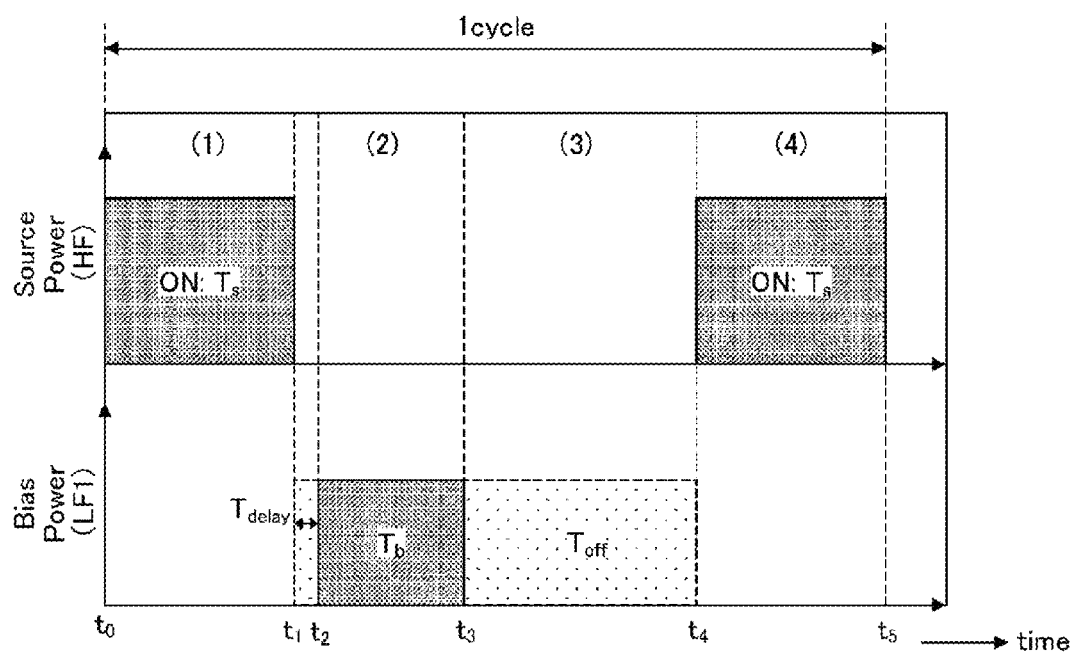
FIG. 5 is a view illustrating pulse patterns of radio-frequency power pulses of two frequencies according to an embodiment.

FIG. 5 is a view illustrating pulse patterns of radio-frequency power pulses of two frequencies according to an embodiment. First, descriptions will be made on the timings for supplying the pulsed signals of the HF power (Source Power) and the LF1 power (Bias Power) that are the radio-frequency powers of the two frequencies illustrated in FIG. 5. In FIG. 5, the horizontal axis represents the time of one cycle, and the vertical axis represents the ON/OFF states of the HF power and the LF1 power. The control of the pulsed signal of each of the HF power and the LF1 power is repeated per cycle that includes periods (1) to (4).

In the control of the radio-frequency power pulses of the two frequencies, the ON state of the HF power and the ON state of the LF1 power do not overlap with each other in time, in the manner that the LF1 power is turned OFF while the HF power is turned ON, and the LF1 power is turned ON while the HF power is turned OFF. The source RF generator 31a is configured to generate the source RF pulsed signal (the HF power), and in the present embodiment, the source RF pulsed signal has the two power levels (ON/OFF). For example, the source RF pulsed signal may have a frequency of 27 MHz.

The first bias RF generator 31b is configured to generate the first bias RF pulsed signal (the LF1 power), and in the present embodiment, the first bias RF pulsed signal has the two power levels (ON/OFF). The frequency of the first bias RF pulsed signal is lower than the frequency of the source RF pulsed signal. For example, the first bias RF pulsed signal has a frequency of 13 MHz.

In the period (1) of FIG. 5, the HF power is turned ON, and the LF1 power is turned OFF. That is, in time $T_s$ from a timing $t_0$ to a timing $t_1$, the HF power is supplied so that plasma containing radicals and ions is generated.

When the HF power is controlled to enter the OFF state at the timing $t_1$ after the time $T_s$ elapses, the radicals, the ions, and the plasma temperature are attenuated with their respective time constants, as in the example illustrated in FIG. 4. According to the attenuation states of the plasma parameters, the timing for turning ON the LF1 power is controlled in the periods (2) and (3) when the HF power is controlled to enter the OFF state. In the period (2), the timing for supplying the LF1 power is controlled, so that the behavior of ions is mainly controlled. In the period (3), the exhaust of by-products is controlled.

For example, in a case where the LF1 power is turned ON when the plasma temperature is high, a large amount of by-products are generated, which may hinder the etching. Accordingly, the LF1 power may be turned ON by avoiding the time when the plasma temperature is high. That is, when the LF1 power is controlled to enter the ON state at a timing $t_2$ shifted by a predetermined delay time $T_{delay}$ from the timing $t_1$ when the HF power is turned OFF, the amount of by-products during etching may be suppressed, and the etching may be promoted.

In the delay time $T_{delay}$, both the HF power and the LF1 power are temporarily turned OFF. Accordingly, the generation of radicals and ions is temporarily stopped before the timing $t_2$ when the LF1 power is supplied. As a result, the flux of ions (the amount of ions) that reach the bottom of a recess being etched may be controlled in time $T_b$ when the LF1 power is being supplied, and the etching may be promoted.

Further, by providing the delay time $T_{delay}$, the LF1 power may be controlled to enter the ON state after the plasma temperature decreases. Accordingly, the ion energy ($\varepsilon_1$) may be increased, the Vpp (peak-to-peak voltage) of the LF1 power may increase, and the incidence angle of ions on the etched recess may be controlled to be more vertical. However, when the delay time $T_{delay}$ is excessively long, the ions are lost due to the attenuation of the ions illustrated in FIG. 4, and thus, the delay time $T_{delay}$ is preset to an appropriate value.

The LF1 power is controlled to enter the OFF state at a timing $t_3$. In the period (3) which is an exhausting period $T_{off}$ from the timing $t_3$ to a timing $t_4$, both the HF power and the LF1 power are controlled to enter the OFF state, so as to exhaust the by-products. The exhausting period $T_{off}$ is preset to time during which the by-products do not adhere to the substrate W.

At the timing $t_4$ after the exhausting period $T_{off}$ elapses, the HF power is controlled to enter the ON state again, and the period (4) is returned to the period (1). In this way, the ON/OFF states of the HF power and the ON/OFF states of the LF1 power are controlled to suppress the ON states of the HF power and the LF1 power from overlapping with each other in time, such that the time $T_s$, the time $T_b$, the delay time $T_{delay}$ are separately controlled. In particular, the first bias RF generator 31b is configured to shift the timing for changing the power level of the first bias RF pulsed signal with respect to the timing for changing the power level of the source RF pulsed signal. Thus, the supply of the HF power and the LF1 power is stopped for the delay time $T_{delay}$ before the timing for supplying the LF1 power. As a result, the flux of ions that reach the bottom of the etched recess may be controlled during the time $T_b$ when the LF1 power is turned ON. However, the timing for supplying the HF power and the LF1 power is not limited thereto. For example, the delay time $T_{delay}$ may not be provided.

(Pulsed Signals of Three Frequencies)

Figure 6:
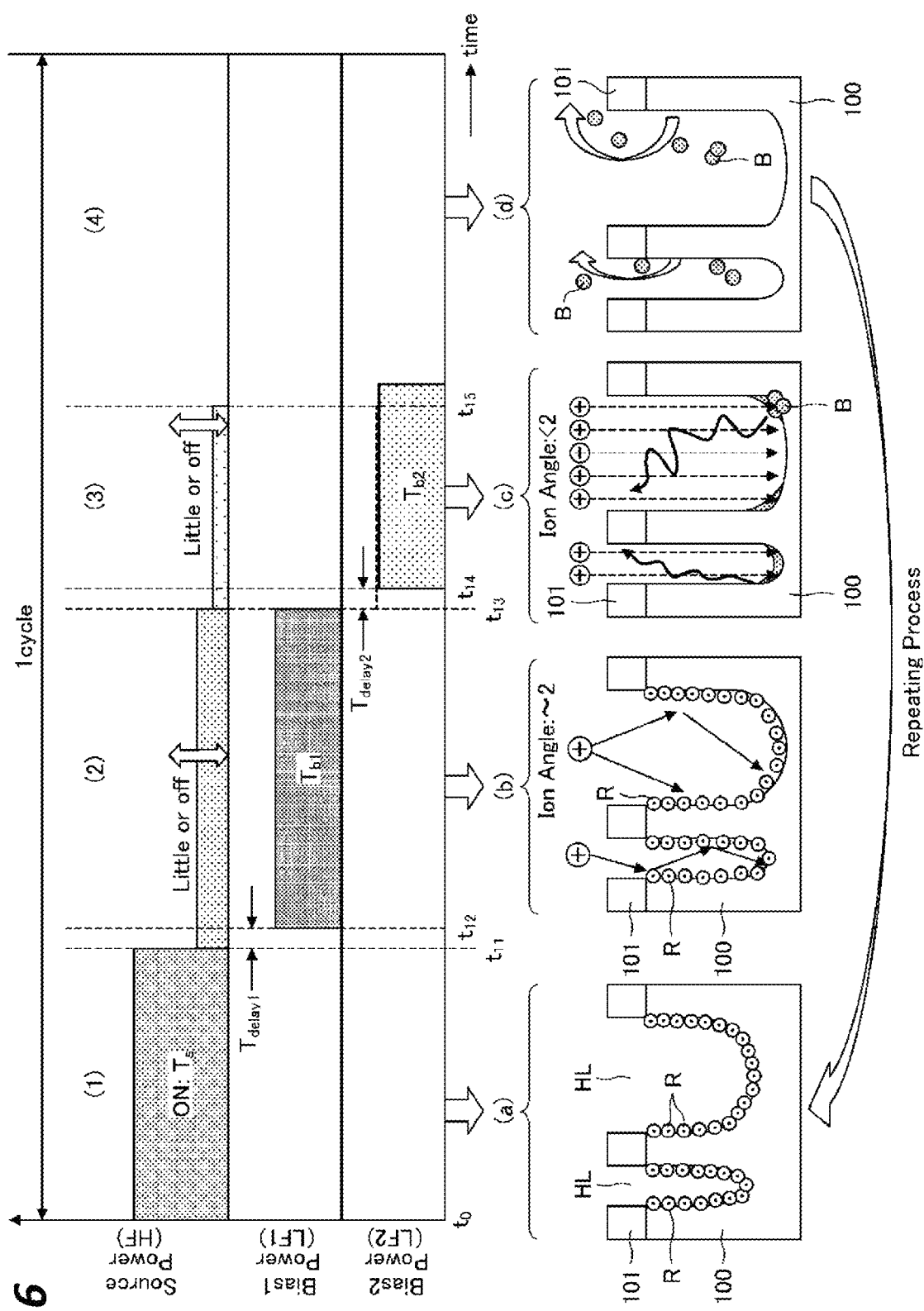
FIG. 6 is a view illustrating pulse patterns of radio-frequency power pulses of three frequencies according to an embodiment.
Figure 7:
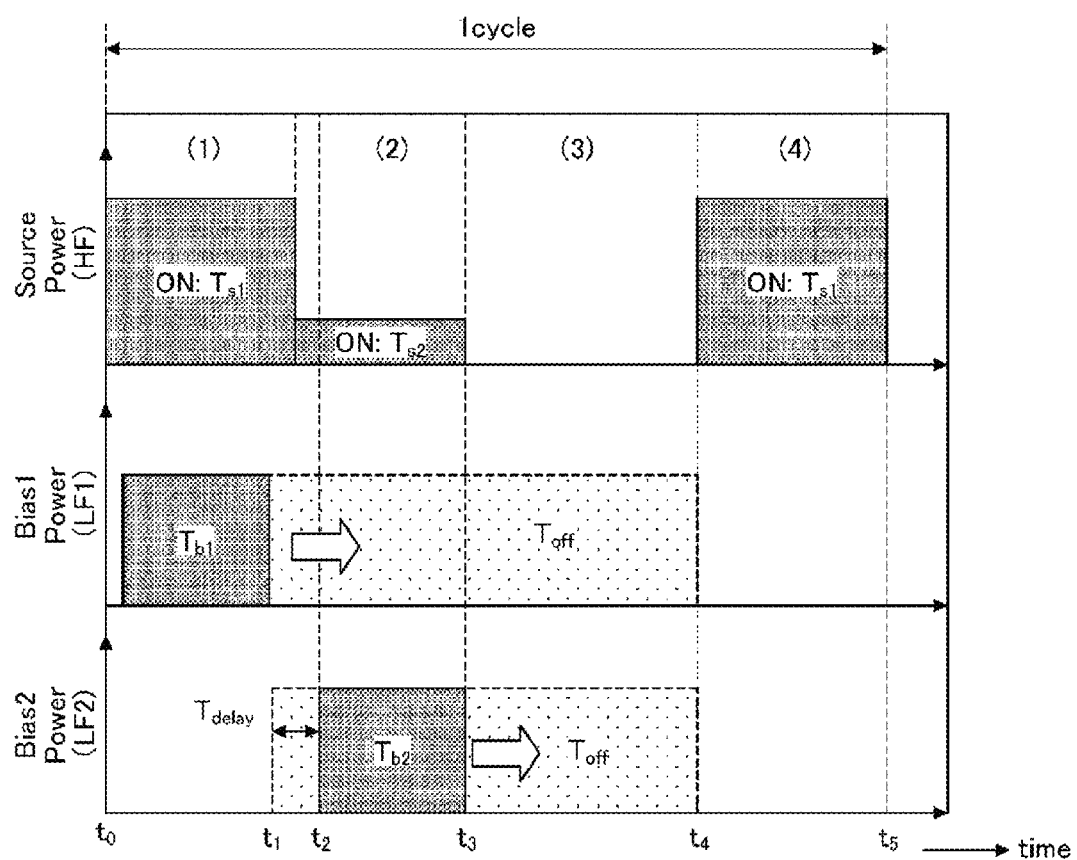
FIG. 7 is a view illustrating pulse patterns of radio-frequency power pulses of three frequencies according to an embodiment.
Figure 8:
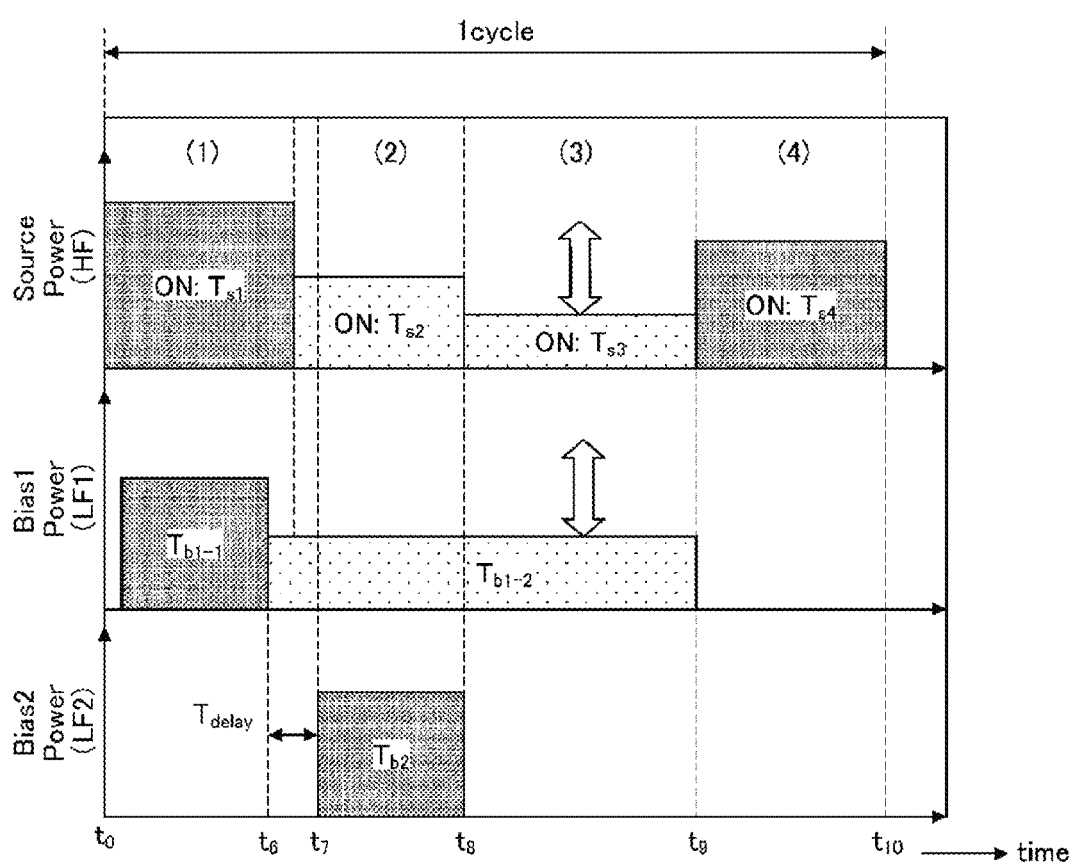
FIG. 8 is a view illustrating pulse patterns of radio-frequency power pulses of three frequencies according to an embodiment.

FIGS. 6 to 8 are views illustrating pulse patterns of radio-frequency power pulses of three frequencies according to an embodiment. First, descriptions will be made on timings for supplying the pulsed signals of the HF power (Source Power), the LF1 power (Bias1 Power), and the LF2 power (Bias2 Power) which are radio-frequency power pulses of three frequencies illustrated in FIGS. 6 to 8. In FIGS. 6 to 8, the horizontal axis represents the time of one cycle, and the vertical axis represents the ON/OFF states of the HF power, the LF1 power, and the LF2 power. The control of the pulsed signal of each of the HF power, the LF1 power, and the LF2 power is repeated per cycle that includes periods (1) to (4).

In the control of the radio-frequency power pulses of the three frequencies, the ON state of the LF1 power and the ON state of the LF2 power do not overlap with each other in time, in the manner that the LF2 power is turned OFF while the LF1 power is ON, and the LF2 power is turned ON while the LF2 power is OFF. The ON state of the HF power and the ON state of the LF1 power may or may not overlap with each other in time, and the ON state of the HF power and the ON state of the LF2 power may or may not overlap with each other in time.

The source RF generator 31a is configured to generate the source RF pulsed signal (the HF power), and in the present embodiment, the source RF pulsed signal has four power levels (High/Mile/Low/Off). The power levels may be arbitrarily set and changed according to a target process. For example, the source RF pulsed signal has a frequency of 27 MHz.

The first bias RF generator 31b is configured to generate the first bias RF pulsed signal (the LF1 power), and in the present embodiment, the first bias RF pulsed signal has two power levels (ON/OFF). That is, the first bias RF pulsed signal has two or more power levels that include a zero (0) power level. The frequency of the first bias RF pulsed signal is lower than the frequency of the source RF pulsed signal. For example, the first bias RF pulsed signal has a frequency of 13 MHz.

The second bias RF generator 31c is configured to generate the second bias RF pulsed signal (the LF2 power), and in the present embodiment, the second bias RF pulsed signal has two power levels (ON/OFF). That is, the second bias RF pulsed signal has two or more power levels that include a zero (0) power level. The frequency of the second bias RF pulsed signal is lower than the frequency of the first bias RF pulsed signal. For example, the second bias RF pulsed signal has a frequency of 1.2 MHz.

In FIGS. 6 to 8, the Source Power (the HF power) represents the state of the source RF pulsed signal, the Bias1 Power (the LF1 power) represents the state of the first bias RF pulsed signal, and the Bias2 Power (the LF2 power) represents the state of the second bias RF pulsed signal.

In the period (1) of FIG. 6, the HF power has the High power level, and the LF1 power and the LF2 power are in the OFF state. That is, during time $T_s$ from a timing $t_0$ to a timing $t_{11}$, plasma that contains radicals and ions is generated by the supply of the HF power. Thus, as illustrated in (a) of FIG. 6, an etching target film 100 is etched through a mask 101, and radicals R mainly adhere to the inner wall of a hole HL formed in the etching target film 100.

When the HF power shifts to the OFF state at the timing $t_{11}$ after the time $T_s$ elapses, the radicals, the ions, and the plasma temperature are attenuated with their respective time constants, as in the example illustrated in FIG. 4. According to the attenuation state of the plasma parameters, the timings for turning ON each of the LF1 power and the LF2 power may be controlled in the periods (2) and (3) when the power level of the HF power is lowered or turned OFF, and the period (4) when the by-products are exhausted.

In the present embodiment, the LF1 power shifts to the ON state at a timing $t_{12}$ shifted by a delay time $T_{delay1}$ from the timing $t_{11}$ when the HF power is lowered from the High power level to the Middle power level (or turned OFF). Thus, as illustrated in (b) of FIG. 6, the flux of ions that reach the bottom of the etched recess may be controlled. Further, the amount of by-products during the etching may be suppressed.

Further, by providing the delay time $T_{delay1}$ such that the LF1 power is turned ON after the plasma temperature decreases, the ion energy ($\varepsilon_1$) may be increased, and the incidence angle of ions may be controlled to be more vertical. However, as illustrated in FIG. 4, when the delay time $T_{delay1}$ is excessively long, the ions are lost, and thus, the delay time $T_{delay1}$ is preset to an appropriate value.

In the period (2), the HF power has the Middle power level, the LF1 power is in the ON state, and the LF2 power is maintained in the OFF state. At a timing $t_{13}$, the HF power shifts to the Low power level (or the OFF state), and the LF1 power shifts to the OFF state. Then, the LF2 power shifts to the ON state at a timing $t_{14}$ shifted (delayed) by a delay time $T_{delay2}$ from the timing $t_{13}$. At the timing $t_{13}$, the HF power is maintained at the Low power level (or the OFF state), and the LF1 power is maintained in the OFF state. In the period (3), the HF power has the Low power level (or the OFF state), the LF2 power is in the ON state, and the LF1 power is in the OFF state.

In the present embodiment, the LF2 power having a frequency lower than the frequency of the LF1 power supplied in the period (2) is supplied in the period (3). The Vpp of the LF2 power is larger than the Vpp of the LF1 power. Accordingly, in the period (3), the Vpp of the bias voltage may be made larger than that in the period (2), the ion energy ($\varepsilon_1$) may be made further larger, and the incidence angle of ions may be controlled to be more vertical. Thus, it is possible to control the flux of ions that reach the bottom of the etched recess in time $T_{b2}$ when the LF2 power is being supplied. As a result, as illustrated in (c) of FIG. 6, a by-product B or the like that remains at, for example, the corners of the bottom of the hole HL may be etched, so that the etching may be promoted. However, as illustrated in FIG. 4, when the delay time $T_{delay2}$ is excessively long, the ions are lost, and thus, the delay time $T_{delay2}$ is preset to an appropriate value.

In this way, in the process of etching a deep hole having a high aspect ratio, the mask selectivity may be improved, and the incidence angle of ions may be made vertical, by using the pulsed signals of the HF power, the LF1 power, and the LF2 power. Thus, the etching shape may be made vertical, or the etching may be promoted. However, the process of etching a deep hole having a high aspect ratio is an example of the substrate processing, and the type of the process is not limited thereto.

In the period (4), the exhaust of the by-products is controlled. That is, in the period (4), the HF power, the LF1 power, and the LF2 power are controlled to enter the OFF state. Thus, as illustrated in (d) of FIG. 6, the by-product B that adheres to the inside of the hole HL is exhausted. As a result, the etching of the next cycle may be promoted. The period (4) is preset to time when the by-product B does not adhere to the substrate W again.

In the example of FIG. 6, the power level of the HF power is controlled to four levels, and the power levels of the LF1 power and the LF2 power are controlled to the two levels of the ON/OFF states. However, the present disclosure is not limited thereto. For example, the power level of the HF power may be controlled to three or more levels.

FIG. 7 illustrates another example of the pulse patterns of the radio-frequency power pulses of the three frequencies. In this example, the control of the pulsed signal of each of the HF power, the LF1 power, and the LF2 power is repeated per cycle that includes periods (1) to (4).

In the period (1), the HF power has the High power level in time $T_{s1}$ from a timing $t_0$ to a timing $t_1$. As a result, plasma that contains radicals and ions is generated.

The LF1 power shifts to the ON state in time $T_{b1}$ that falls within the time $T_{s1}$ when the HF power has the High power level. As a result, the generated ions are drawn into the substrate W, and the etching is promoted.

At the timing $t_1$, the LF1 power shifts to the OFF state, and then, the HF power shifts to the Middle power level. That is, in time $T_{s2}$, the generation of radicals and ions decreases due to the supply of the HF power that has been weakened. In the next period (3), the HF power shifts to the OFF state. The HF power in the period (3) may have the power level lower than the power level in the period (2). In this case, the HF power has the Middle power level in the period (2) and the Low power level in the period (3). As in the example illustrated in FIG. 4, the radicals, the ions, and the plasma temperature are attenuated with their respective time constants. According to the attenuation state of the plasma parameters and according to the power level of the HF power, the timings for turning ON/OFF the LF1 power and the LF2 power are controlled.

For example, in a case where the LF1 power or the LF2 power is turned ON when the plasma temperature is high, a large amount of by-products are generated, which may hinder the etching. Accordingly, it may be conceivable to turn ON the LF2 power while avoiding the time when the plasma temperature is high. That is, the plasma temperature decreases at the timing $t_2$ after the predetermined delay time $T_{delay}$ elapses from the timing $t_1$. At this timing, the LF2 power shifts to the ON state. That is, the LF2 power shifts to the ON state after time is shifted (delayed) by the delay time $T_{delay}$ from the timing $t_1$ when the LF1 power shifts to the OFF state. As a result, the amount of by-products during the etching may be suppressed, and the etching may be promoted. Further, in the present embodiment, the power level of the HF power in the period (2) is lower than the power level of the HF power in the period (1). However, the HF power in the period (2) may be in the OFF state.

In the present embodiment, in the delay time $T_{delay}$, the LF1 power enters the OFF state, and the power level of the HF power is lowered. Thus, the generation of radicals and ions may be reduced in the delay time $T_{delay}$ before the timing $t_2$ when the LF2 power is supplied. As a result, it is possible to control the flux of ions that reach the bottom of the recess formed in the etching target film in the time $T_{b2}$ when the LF2 power is being supplied.

Further, in the period (1), the LF2 power is in the OFF state, and shifts to the ON state after the plasma temperature decreases, so that the incidence angle of ions may be controlled to be more vertical. However, as illustrated in FIG. 4, when the delay time $T_{delay}$ is excessively long, the ions are lost, and thus, the delay time $T_{delay}$ is preset to an appropriate value.

Through this control, the ON/OFF states of the LF1 power and the ON/OFF states of the LF2 power are caused to shift to the ON state in different times, so that the behavior of the ions is mainly controlled. In the time $T_{b1}$, the LF1 power has a power level larger than zero (0), and the LF2 power has the zero (0) power level. In the time $T_{b2}$, the LF2 power has a power level larger than zero (0), and the LF1 power has the zero (0) power level. That is, the times when the LF1 power and the LF2 power have the power levels larger than zero (0) do not overlap with each other.

The LF2 power implements the mask selectivity higher than that of the LF1 power, and enables the vertical etching. In the period (1) when the power level of the HF power is higher than that in the period (2), the radicals and the ions are generated in large amounts, and the effects described above may be hardly achieved even though the LF2 power is supplied in the period (1). Meanwhile, in the period (2) when the power level of the HF power is lower than that in the period (1), the generation of radicals and ions decreases, and the effects described above may easily be achieved by supplying the LF2 power in the period (2). Accordingly, by supplying the LF2 power in the period (2), the ion energy may be increased, and the incidence angle of ions may be made vertical. As a result, in the period (2), the mask selectivity is higher than that in the period (1), and the vertical etching may be implemented.

Further, the LF1 power and the LF2 power may generate the pulsed signals that have the two power levels of the ON state and the OFF state. However, the LF1 power and the LF2 power may generate pulsed signals that have two or more power levels, such as the ON state, the OFF state, and the Middle power level. The LF1 power and the LF2 power may have two different ON states.

At a timing $t_3$, the HF power shifts to the OFF state. In the period (3), the exhaust of by-products is controlled. That is, in the exhausting period Tof from the timing $t_3$ to a timing $t_4$, the HF power, the LF1 power, and the LF2 power are in the OFF state, so that the by-products are exhausted. The exhausting period $T_{off}$ is preset to time when the by-products do not adhere to the substrate W.

At the timing $T_4$ after the exhausting period $T_{off}$ elapses, the HF power shifts to the High power level, and at a timing $t_5$, the period (4) is returned to the period (1). In this way, the power levels of the HF power, the LF1 power, and the LF2 power are separately controlled.

In the control of the pulsed signals illustrated in FIGS. 6 and 7, the timing for changing the power level of the second bias RF pulsed signal is shifted with respect to the timing for changing the power level of the source RF pulsed signal and/or the power level of the first bias RF pulsed signal. However, the present disclosure is not limited thereto, and the delay time may not be provided.

FIG. 8 illustrates another example of the pulse patterns of the radio-frequency power pulses of the three frequencies. In this example as well, the control of the pulsed signal of each of the HF power, the LF1 power, and the LF2 power is repeated per cycle that includes periods (1) to (4).

Differences between the present example and the patterns of the pulsed signals of FIG. 7 will be described. In the example of FIG. 7, the HF power has the three power levels that include the zero (0) power level (the OFF state). Meanwhile, the HF power may have four power levels as in the present example. Further, the HF power may or may not include the zero (0) power level. For example, as in the present example, in the period (3) when the by-products are exhausted, the power level of the HF power may be lowered to maintain the ON state of the HF power, without turning OFF the HF power.

Further, in FIG. 7, the LF1 power has the two levels of ON and OFF. Meanwhile, as in the present example, the LF1 power may have three levels that include two levels of the ON states in time $T_{b1-1}$ and time $T_{b1-2}$, and the zero (0) power level. Further, in the present example as well, the ON state (the High power level) when the power level of the LF1 power is the highest, and the ON state of the LF2 power do not overlap with each other in time.

[Modification of Plasma Processing Apparatus]

Figure 9:
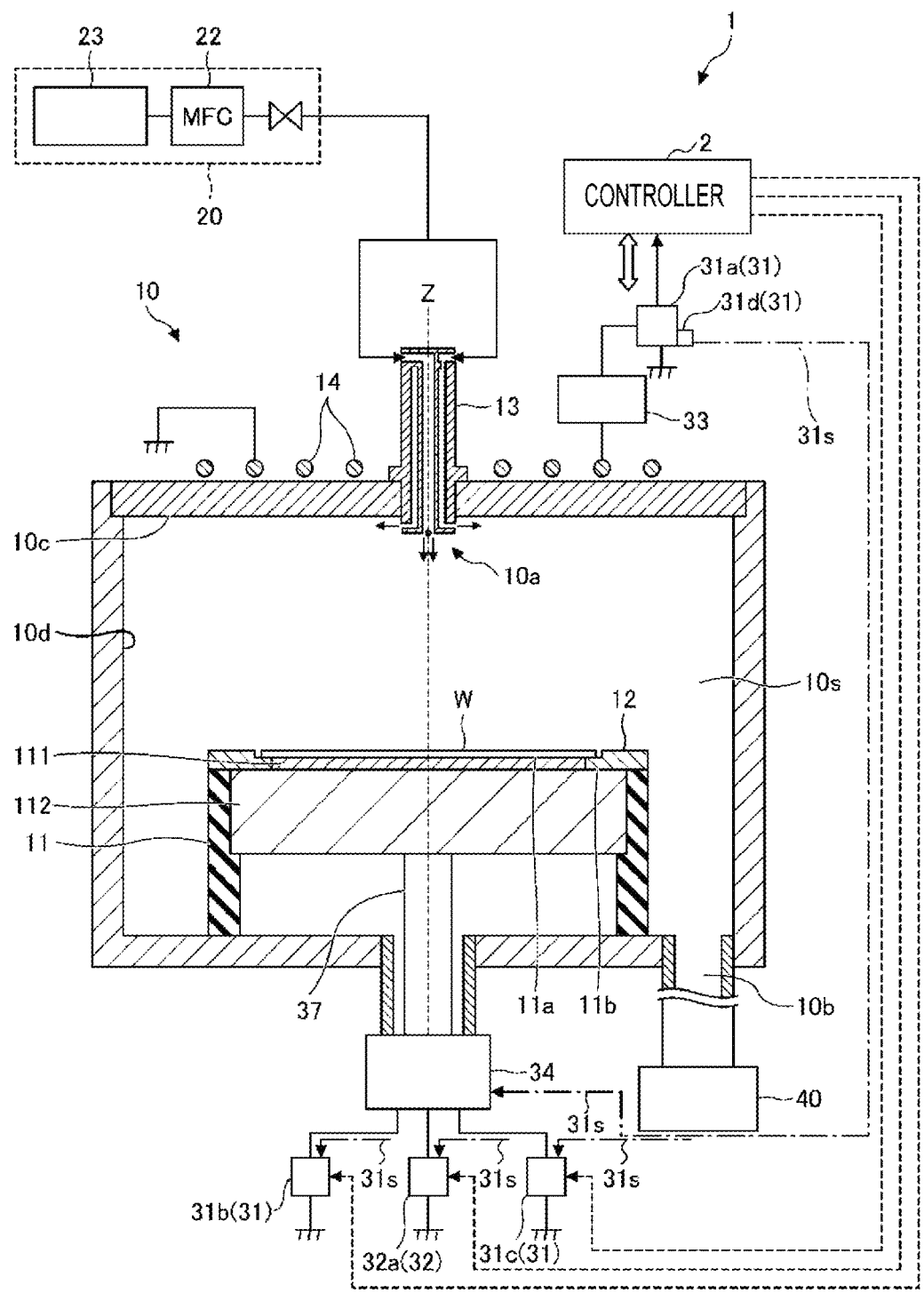
FIG. 9 is a view illustrating an example of a plasma processing apparatus according to a modification to the embodiment.

A modification of a plasma processing apparatus 1 will be described with reference to FIG. 9. FIG. 9 is a view illustrating an example of the plasma processing apparatus 1 according to the modification of the embodiment. The plasma processing apparatus 1 according to the modification is different from the plasma processing apparatus 1 illustrated in FIG. 2, only in that the power supply includes a DC power supply 32, in addition to the configuration of the plasma processing apparatus 1 illustrated in FIG. 2.

The DC power supply 32 includes a DC pulse generator 32a coupled to the substrate support 11. The DC pulse generator 32a is connected to the conductive member 112 of the substrate support 11 via the second matching circuit 34, and configured to generate a bias DC pulsed signal (voltage). The generated bias DC pulsed signal is applied to the conductive member 112 of the substrate support 11. The DC pulse generator 32a may be provided in addition to the RF power supply 31, or may be provided in place of the second bias RF generator 31c. Since the other configuration of the plasma processing apparatus 1 according to the modification is the same as that of the plasma processing apparatus 1 illustrated in FIG. 2, descriptions thereof will be omitted.

Figure 10:
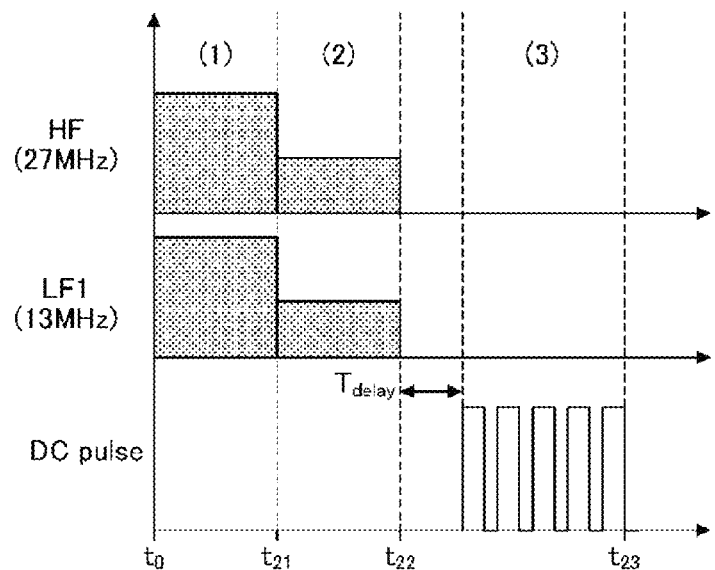
FIG. 10 is a view illustrating pulse patterns of a DC pulse and a radio-frequency power pulse according to Modification 1.
Figure 11:
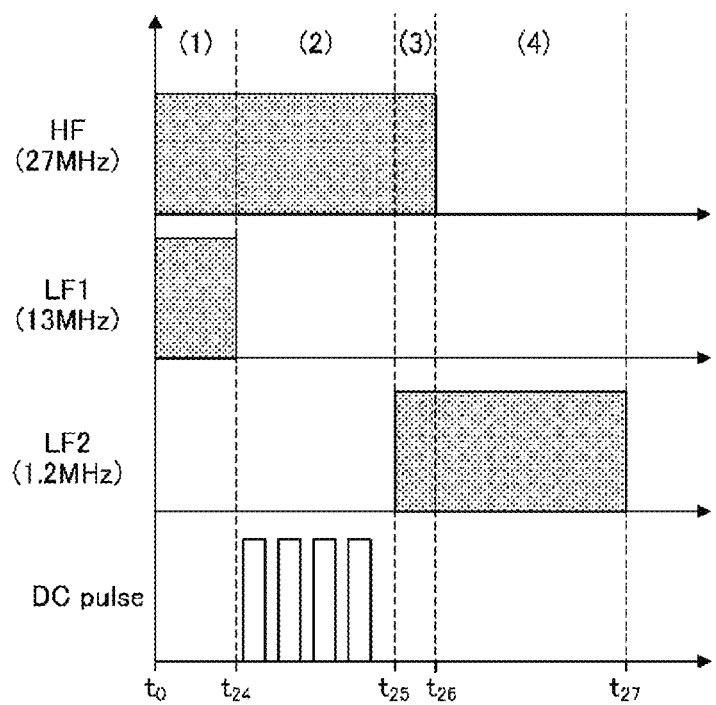
FIG. 11 is a view illustrating pulse patterns of a DC pulse and a radio-frequency power pulse according to Modification 2.
Figure 12:
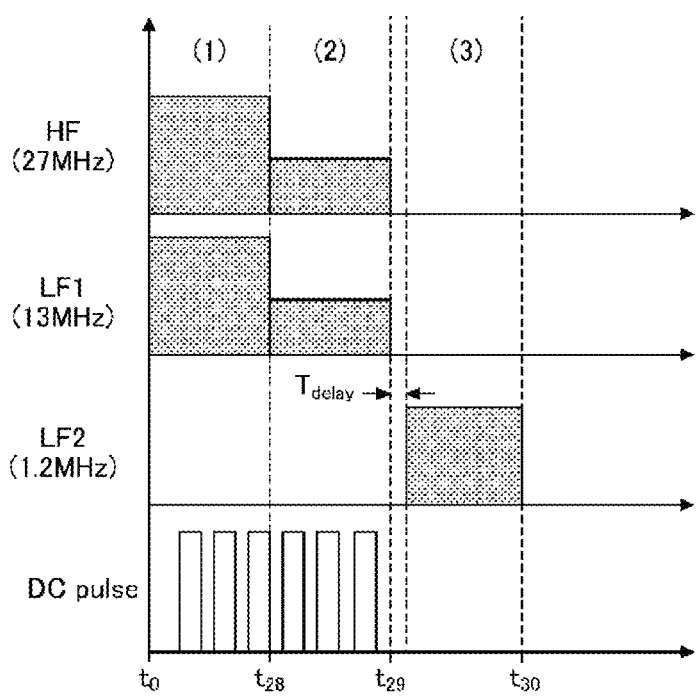
FIG. 12 is a view illustrating pulse patterns of a DC pulse and a radio-frequency power pulse according to Modification 3.

Next, an example of pulse patterns of a DC pulse and radio-frequency power pulses according to Modifications 1 to 3 will be described with reference to FIGS. 10 to 12. FIGS. 10 to 12 are views illustrating pulse patterns of the DC pulse and the radio-frequency power pulses according to Modifications 1 to 3.

Modification 1 of FIG. 10 represents the pulse patterns of the HF power, the LF1 power, and a DC pulse voltage (a DC pulsed signal), in a case where the DC pulse generator 32a is provided in place of the second bias RF generator 31c. In Modification 1, the control of the pulsed signal of each of the HF power, the LF1 power, and the DC pulse voltage is repeated per cycle that includes periods (1) to (3) and an exhaust time (not illustrated) after the period (3).

In the period (1) from a timing $t_0$ to a timing $t_{21}$, the HF power has the High power level, the LF1 power has the High power level, and the DC pulse voltage is in the OFF state. At the timing $t_{21}$, the HF power shifts to the Low power level, the LF1 power shifts to the Low power level, and the DC pulse voltage is maintained in the OFF state. In the period (2) from the timing $t_{21}$ to a timing $t_{22}$, the HF power has the Low power level, the LF1 power has the Low power level, and the DC pulse voltage is in the OFF state. At the timing $t_{22}$, the HF power shifts to the OFF state, the LF1 power shifts to the OFF state, and the DC pulse voltage is maintained in the OFF state. After the delay time $T_{delay}$ elapses from the timing $t_{22}$, the DC pulse voltage shifts to the ON state. In the period (3) from the timing $t_{22}$ to a timing $t_{23}$ after the delay time $T_{delay}$ elapses, the HF power and the LF1 power are in the OFF state, and the DC pulse voltage is in the ON state. The DC pulse generator 32a generates a pulse sequence in the ON state of the DC pulse voltage.

As described above, in Modification 1, the LF1 power has the zero (0) power level in the ON time of the DC pulse voltage during the period (3). The DC pulse generator 32a is configured to generate a DC pulsed signal in the ON time of DC, and stop the generation of the DC pulse in the OFF time of DC which is different from the ON time of DC.

Modification 2 of FIG. 11 represents the pulse patterns of the HF power, the LF1 power, the LF2 power, and the DC pulse voltage, in a case where the DC pulse generator 32a is provided in addition to the second bias RF generator 31c. In Modification 2, the control of the pulsed signal of each of the HF power, the LF1 power, the LF2 power, and the DC pulse voltage is repeated per cycle that includes periods (1) to (4) and an exhausting period (not illustrated) after the period (4).

In the period (1) from a timing $t_0$ to a timing $t_{24}$, the HF power and the LF1 power are in the ON state, and the LF2 power and the DC pulse voltage are in the OFF state. At the timing $t_{24}$, the HF power is maintained in the ON state, the LF1 power shifts to the OFF state, the LF2 power is maintained in the OFF state, and the DC pulse voltage shifts to the ON state. In the period (2) from the timing $t_{24}$ to a timing $t_{25}$, the HF power is in the ON state, the LF1 power and the LF2 power are in the OFF state, and the DC pulse voltage is in the ON state. The DC pulse generator 32a generates a pulse sequence in the ON state of the DC pulse voltage. At the timing $t_{25}$, the HF power is maintained in the ON state, the LF1 power is maintained in the OFF state, the LF2 power shifts to the ON state, and the DC pulse voltage shifts to the OFF state. In the period (3) from the timing $t_{25}$ to a timing $t_{26}$, the HF power is in the ON state, the LF1 power is in the OFF state, the LF2 power is in the ON state, and the DC pulse voltage is in the OFF state. At the timing $t_{26}$, the HF power shifts to the OFF state, the LF1 power is maintained in the OFF state, the LF2 power is maintained in the ON state, and the DC pulse voltage is maintained in the OFF state. In the period (4) from the timing $t_{26}$ to a timing $t_{27}$, the HF power is in the OFF state, the LF1 power is in the OFF state, the LF2 power is in the ON state, and the DC pulse voltage is in the OFF state.

As described above, in Modification 2, the LF2 power has the zero (0) power level in the ON time of the DC pulse voltage during the period (2). The DC pulse generator 32a is configured to generate a DC pulsed signal in the ON time of DC, and stop the generation of the DC pulsed signal in the OFF time of DC which is different from the ON time of DC.

Modification 3 of FIG. 12 represents another example of the pulse patterns of the HF power, the LF1 power, the LF2 power, and the DC pulse voltage, in a case where the DC pulse generator 32a is provided in addition to the second bias RF generator 31c. In Modification 3, the control of the pulsed signal of each of the HF power, the LF1 power, the LF2 power, and the DC pulse voltage is repeated per cycle that includes periods (1) to (3) and an exhausting period (not illustrated) after the period (3).

In the period (1) from a timing $t_0$ to a timing $t_{28}$, the HF power has the High power level, the LF1 power has the High power level, the LF2 power is in the OFF state, and the DC pulse voltage is in the ON state. The DC pulse voltage shifts to the ON state with a delay that corresponds to the shift of the HF power to the High power level and the shift of the LF1 power to the High power level. The DC pulse generator 32a generates a pulse sequence in the ON state of the DC pulse voltage. At the timing $t_{28}$, the HF power shifts to the Low power level, the LF1 power shifts to the Low power level, the LF2 power is maintained in the OFF state, and the DC pulse voltage is maintained in the ON state. In the period (2) from the timing $t_{28}$ to a timing $t_{29}$, the HF power has the Low power level, the LF1 power has the Low power level, the LF2 power is in the OFF state, and the DC pulse voltage is in the ON state. At the timing $t_{29}$, the HF power shifts to the OFF state, the LF1 power shifts to the OFF state, the LF2 power is maintained in the OFF state, and the DC pulse voltage shifts to the OFF state. After the delay time $T_{delay}$ elapses from the timing $t_{29}$, the LF2 power shifts to the ON state. In the period (3) from the timing $t_{29}$ to a timing $t_{30}$ after the delay time $T_{delay}$ elapses, the HF power and the LF1 power are in the OFF state, the LF2 power is in the ON state, and the DC pulse voltage is in the OFF state.

As described above, in Modification 3, the LF2 power has the zero (0) power level in the ON time of the DC pulse voltage during the periods (1) and (2). The DC pulse generator 32a is configured to generate a DC pulsed signal in the ON time of DC, and stop the generation of the DC pulsed signal in the OFF time of DC which is different from the ON time of DC.

As described above, the ON state of the DC pulse voltage and the ON state of the LF2 power do not overlap with each other in time. Further, the ON state of the DC pulse voltage and the ON state of the LF1 power may or may not overlap with each other in time.

As described above, according to the plasma processing apparatus and the plasma processing method of the present embodiment, the performance of the process may be improved by using three radio-frequency power pulsed signals.

For example, in the embodiments above, the inductively coupled plasma apparatus is as an example. However, the present disclosure is not limited thereto, and may be applied to other plasma apparatus. For example, a capacitively coupled plasma (CCP) apparatus may be used, instead of the inductively coupled plasma apparatus. In this case, the capacitively coupled plasma apparatus includes an upper electrode and a lower electrode. The lower electrode is disposed inside the substrate support, and the upper electrode is disposed above the substrate support. Then, the first matching circuit 33 is coupled to the upper electrode, and the second matching circuit 34 is coupled to the lower electrode. Accordingly, the first matching circuit 33 is coupled to the antenna 14 of the inductively coupled plasma apparatus or the upper electrode of the capacitively coupled plasma apparatus. That is, the first matching circuit 33 is coupled to the chamber 10.

According to an aspect of the present disclosure, the performance of a process may be improved by using three radio-frequency power pulsed signals.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:
   a plasma processing chamber;
   a substrate support disposed in the plasma processing chamber;
   a source RF generator coupled to the plasma processing chamber, and configured to generate a source RF pulsed signal;
   a first bias RF generator configured to generate a first bias RF pulsed signal;
   a second bias RF generator configured to generate a second bias RF pulsed signal;
   a first separation circuit connected between the first bias RF generator and the substrate support, and configured to suppress a coupling of the second bias RF pulsed signal from the second bias RF generator to the first bias RF generator and supply the first bias RF pulsed signal from the first bias RF generator to the substrate support, and
   a second separation circuit connected between the second bias RF generator and the substrate support, and configured to suppress a coupling of the first bias RF pulsed signal from the first bias RF generator to the second bias RF generator and supply the second bias RF pulsed signal from the second bias RF generator to the substrate support.

2. The plasma processing apparatus according to claim 1, further comprising:
   a synchronization signal generator configured to generate a synchronization signal for synchronizing the source RF generator, the first bias RF generator, and the second bias RF generator with each other.

3. The plasma processing apparatus according to claim 2, wherein the synchronization signal generator is disposed in any one of the source RF generator, the first bias RF generator, and the second bias RF generator.

4. The plasma processing apparatus according to claim 1, wherein the source RF pulsed signal includes at least three power levels, the first bias RF pulsed signal includes at least two power levels, and the second bias RF pulsed signal includes at least two power levels.

5. The plasma processing apparatus according to claim 4, wherein the second bias RF pulsed signal has two power levels including a zero power level.

6. The plasma processing apparatus according to claim 4, wherein the first bias RF pulsed signal has a power level larger than zero during a first time period, and
   The second bias RF pulsed signal has a zero power level during the first time period.

7. The plasma processing apparatus according to claim 1, wherein a frequency of the second bias RF pulsed signal is different from a frequency of the first bias RF pulsed signal.

8. The plasma processing apparatus according to claim 1, wherein a frequency of the second bias RF pulsed signal is lower than a frequency of the first bias RF pulsed signal.

9. The plasma processing apparatus according to claim 1, wherein the first bias RF generator is configured to shift a timing for changing a power level of the first bias RF pulsed signal with respect to a timing for changing a power level of the source RF pulsed signal.

10. The plasma processing apparatus according to claim 1, wherein the second bias RF generator is configured to shift a timing for changing a power level of the second bias RF pulsed signal with respect to a timing for changing a power level of the source RF pulsed signal and/or a timing for changing a power level of the first bias RF pulsed signal.

11. The plasma processing apparatus according to claim 1, wherein the first separation circuit includes a capacitor and a first inductor, and
    the second separation circuit includes a second inductor.

12. A plasma processing apparatus comprising:
    a plasma processing chamber;
    a substrate support disposed in the plasma processing chamber;
    a RF generator coupled to the substrate support, and configured to generate an RF pulsed signal;
    a DC pulse generator coupled to the substrate support, and configured to generate a DC pulsed signal;
    a first separation circuit connected between the RF generator and the substrate support, and configured to suppress a coupling of the DC pulsed signal from the DC pulse generator to the RF generator and supply the RF pulsed signal from the RF generator to the substrate support, and
    a second separation circuit connected between the DC pulse generator and the substrate support, and configured to suppress a coupling of the RF pulsed signal from the RF generator to the DC pulse generator and supply the DC pulsed signal from the DC pulse generator to the substrate support.

13. The plasma processing apparatus according to claim 12, further comprising:
    a synchronization signal generator configured to generate a synchronization signal for synchronizing the RF generator and the DC pulse generator with each other.

14. The plasma processing apparatus according to claim 12, wherein the first separation circuit includes a capacitor and a first inductor, and the second separation circuit includes a second inductor.

15. A plasma processing apparatus comprising:
    a plasma processing chamber;
    a substrate support disposed in the plasma processing chamber;
    an antenna disposed on or above the plasma processing chamber;
    a source RF generator coupled to the antenna, and configured to generate a source RF pulsed signal;

a DC pulse generator coupled to the substrate support, and configured to generate a bias DC pulsed signal;

a bias RF generator coupled to the substrate support, and configured to generate a bias RF pulsed signal;

a first separation circuit connected between the bias RF generator and the substrate support, and configured to suppress a coupling of the bias DC pulsed signal from the DC pulse generator to the bias RF generator and supply the bias RF pulsed signal from the bias RF generator to the substrate support; and a second separation circuit connected between the DC pulse generator and the substrate support, and configured to suppress a coupling of the bias RF pulsed signal from the bias RF generator to the DC pulse generator and supply the bias DC pulsed signal from the DC pulse generator to the substrate support.

16. The plasma processing apparatus according to claim 15, wherein the first separation circuit includes a capacitor and a first inductor, and the second separation circuit includes a second inductor.

17. The plasma processing apparatus according to claim 15, further comprising:

a synchronization signal generator configured to generate a synchronization signal for synchronizing the source RF generator, the bias RF generator and the DC pulse generator with each other.

* * * * *